United States Patent [19]
Keeth et al.

[11] Patent Number: 5,981,322
[45] Date of Patent: Nov. 9, 1999

[54] METHOD FOR PREVENTING LATCH-UP IN CMOS INTEGRATED CIRCUIT DEVICES

[75] Inventors: Brent Keeth; Robert B. Kerr, both of Boise, Id.

[73] Assignee: Micron Technology, Inc., Boise, Id.

[21] Appl. No.: 09/094,043

[22] Filed: May 9, 1998

Related U.S. Application Data

[63] Continuation of application No. 08/790,906, Jan. 29, 1997.

[51] Int. Cl.$^6$ .............................................. H01L 21/8238
[52] U.S. Cl. ......................... 438/199; 438/200; 438/210
[58] Field of Search .................................... 438/199, 200, 438/210

[56] References Cited

U.S. PATENT DOCUMENTS

| | | | |
|---|---|---|---|
| 4,701,780 | 10/1987 | Hankins et al. | 357/51 |
| 4,807,010 | 2/1989 | Winnerl et al. | 357/42 |
| 5,032,892 | 7/1991 | Chern et al. | 357/51 |
| 5,406,123 | 4/1995 | Narayan | 257/767 |

OTHER PUBLICATIONS

"IBM Technical Disclosure Bulletin, vol. 29, No.5 ", 1967, (Sep.1986).
Furuyama, T., et al., "A Latch–Up–Like New Failure Mechanism for High–Density CMOS Dynamic RAM's", *IEEE J. of Solid–State Circuis*, 25, 42–47,(1990) Feb.
Herman, L., "Overcoming the Problems of SCR Latchup", *New Electronics*, 4, 44–50, (1986)Mar. 4, 1986.

*Primary Examiner*—John F. Niebling
*Assistant Examiner*—Chistopher Lattin
*Attorney, Agent, or Firm*—Schwegman, Lundberg, Woessner & Kluth P.A.

[57] ABSTRACT

An integrated circuit structure for preventing latch-up of an integrated circuit device, such as a dynamic random access memory, that is operated with a negative substrate bias in use of the device. The integrated circuit structure includes a p-type substrate having an n-well region formed therein, with a rectifying junction formed in a lightly doped portion of the n-well region and connected to provide a path to ground for clamping the substrate to ground during power-up conditions. In another embodiment, a rectifying junction formed in a lightly doped portion of the n-well region functions as a diode clamp for a pumped bias voltage for the n-well region. In forming the rectifying junction in the n-well region, the n-plus ion implantation mask that is used in forming n-plus doped regions in the n-well region is used to mask portions of the n-well region during the n-plus ion implantation process and a metal barrier layer is formed on the exposed lightly doped portions of the n-well region, so that a Schottky diode is formed. Also described is a method for fabricating an integrated circuit structure which includes forming a rectifying junction in the well portion for providing a diode clamp between voltage sources of the integrated circuit structure.

12 Claims, 9 Drawing Sheets

METHOD FOR PREVENTING LATCH-UP IN CMOS INTEGRATED CIRCUIT DEVICES

This application is a continuation of U.S. patent application Ser. No. 08/790,906, filed Jan. 29, 1997 (the '906 Application). The '906 Application is incorporated herein by reference.

FIELD OF THE INVENTION

The present invention relates generally to semiconductor technology, and in particular, the present invention relates to a method and integrated circuit structure for preventing latch-up in integrated circuit devices, such as dynamic random access memories, that employ a substrate back bias in use of the device.

BACKGROUND OF THE INVENTION

A problem occurring in CMOS integrated circuit devices is a parasitic effect called "latch-up." Latch-up can be triggered by transient currents or voltages within the integrated circuit device during power up. The problem of latch-up has been controlled to some extent through the use of improved fabrication processes and by fabricating latch-up prevention mechanisms in the integrated circuit structures. However, most known latch-up prevention mechanisms are not effective in applications in which the substrate of the integrated circuit device is pumped to a negative back bias potential in use of the device.

FIG. 1, which is labeled "PRIOR ART," is a cross section of a portion of an integrated circuit device having an n-well structure 10 with a pumped substrate back bias VBB being applied to the substrate 12. On any given design for an integrated circuit device, such as that illustrated in FIG. 1, a parasitic capacitance exists between the supply voltage terminal VCC of the integrated circuit device and the substrate as a result of semiconductor junctions, primarily n-well to substrate junctions. Moreover, a parasitic capacitance exists between the ground supply terminal VSS of the integrated circuit device and the substrate as a result of semiconductor junctions, primarily n-MOS to substrate junctions.

Referring additionally to FIG. 2, which is also labeled "PRIOR ART," these parasitic capacitances, represented by capacitors Cw and Cs, form a capacitive divider between a regulated voltage VCC, derived from an external supply voltage VCCX (FIG. 3), and the substrate. During power up, the capacitive divider formed by the parasitic capacitances Cw and Cs, causes the substrate 12 to couple above ground (VSS) until such time as the substrate bias pump that produces the back bias voltage VBB can turn on and begin to drive the substrate 12 negative.

The relationship between the back bias voltage VBB and the regulated supply voltage VCC is illustrated in FIG. 3. As there shown, at power up, the substrate voltage VBB rises until the substrate back bias is able to drive the substrate negative. If the substrate 12 couples positive to the point that pn junctions of the integrated circuit device become forward biased, then latch-up will occur.

Latch-up can also occur when the pumped voltage VCCP, that is used for biasing n-well regions formed in integrated circuit memory devices, is less than the supply voltage VCC by at least one Vt, the threshold voltage for a pn diffusion junctions existing between an n-well and the p active area within the n-well. Accordingly, NMOS diode clamps are used to prevent the pumped voltage VCCP and the voltage on the associated n-wells from falling more than one Vt below the supply voltage VCC. However, the pn junctions forward bias around 700 millivolts and the threshold voltage Vt for NMOS diodes is about 800 to 900 millivolts. Thus, the diffusion junctions can become forward biased before the threshold voltage for the NMOS diode is reached, particularly under power-up conditions.

The phenomenon of latch-up is well understood, and many approaches have to be implemented to control or even eliminate latch-up. For example, a method of construction of a diode clamp for averting forward biasing of a parasitic pnp transistor of a semiconductor device is disclosed in an article appearing in the IBM Technical Disclosure Bulletin, Vol. 29, No. 5, October 1986, page 1967 and which is entitled "Prevention Of CMOS Circuit Latch-Up." In making the device, the chip is processed to the point of source/drain formation using standard processes. A mask is then applied to the chip surface to expose only the p-channel drain. Then, the drain is etched with anisotropic chemical etchants and coated with titanium silicide to form a Schottky diode. The Schottky diode is connected to shunt the emitter-base circuit of the parasitic pnp transistor to prevent the emitter-base junction of the parasitic pnp transistor from being biased into an active mode. However, this arrangement does not provide protection against latch-up for integrated circuit devices that have their substrates coupled to a substrate bias source that maintains the substrate at a negative potential in use of the device. Moreover, producing this device requires the use of a separate mask and requires additional process steps which increases the cost of fabricating the integrated circuit device.

Thus, although latch-up prevention mechanisms have been proposed for preventing latch-up in integrated circuit devices, most known latch-up prevention mechanisms are not effective in applications in which the substrate of the integrated circuit device is pumped to a negative back bias potential in use of the device.

For the reasons stated above, and for other reasons stated below which will become apparent to those skilled in the art upon reading and understanding the present specification, there is a need in the art for a method and integrated circuit structure for preventing pn junctions of integrated circuit devices from becoming forward biased during power-up to prevent latch-up of integrated circuit devices that are operated with a negative substrate bias, or a boosted n-well bias, and which have minimal impact on the fabrication process and do not significantly increase the cost for fabricating such integrated circuit devices.

SUMMARY OF THE INVENTION

The present invention provides an integrated circuit structure and method for preventing latch-up of an integrated circuit device that is operated with a negative substrate bias or a boosted bias in use of the device. In accordance with the invention, a rectifying junction is formed in a well region of a substrate of an integrated circuit structure of the type that includes parasitic pnp and npn transistors. The rectifying junction is formed by depositing a layer of metal on a lightly doped portion of the well region, creating a Schottky diode, which clamps the substrate to a reference potential, such as ground, to prevent parasitic junctions of the integrated circuit structure from becoming forward biased, particularly during power-up conditions.

More specifically, in accordance with one aspect of the invention, an integrated circuit structure includes a semiconductor substrate of a material of a first conductivity type with a heavily doped region of the first conductivity type formed in the substrate. A well region of a material of a second conductivity type is formed in the substrate and includes a first portion heavily doped by a material of the second conductivity type and a second portion lightly doped by a material of the second conductivity. The first doped portion of the substrate is coupled to a source of a bias substrate by a first conductor and the first doped portion of the well region is coupled to a reference potential by a second conductor. The well region includes a rectifying junction and the substrate is coupled to the reference potential through a path that includes the rectifying junction.

In accordance with another aspect of the invention, there is provided a method for fabricating an integrated circuit device on a substrate of a material of a first conductivity type. The method includes forming on the substrate a well region of a material of a second conductivity type; forming a first metal conductor on the substrate for allowing a substrate bias to be applied to the substrate, and forming a second metal conductor on the substrate for allowing the well region to be coupled to a reference potential, such as ground. A rectifying junction is formed in a portion of the well region in the proximity of the second metal conductor and connected to the first metal conductor such that the substrate bias conductor is coupled to a reference potential through a path including the rectifying junction, a portion of the well region, and the second metal conductor.

In one embodiment in which the well region comprises n-type material, the rectifying junction is formed by using the n-plus ion implantation mask to mask off portions of the n-well region during the formation of an n-plus doped region in the n-well region. This leaves exposed a lightly n-doped portions of the n-well region on which are deposited a barrier layer material, forming one or more rectifying junctions that function as Schottky diodes. No additional mask is required because the n-plus implant mask is modified to provide the lightly doped regions required for forming the diode.

DESCRIPTION OF THE PREFERRED EMBODIMENTS

In the following detailed description of the preferred embodiments, reference is made to the accompanying drawings which form a part hereof, and in which is shown by way of illustration specific preferred embodiments in which the invention may be practiced. The preferred embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the appended claims.

Figure 1:
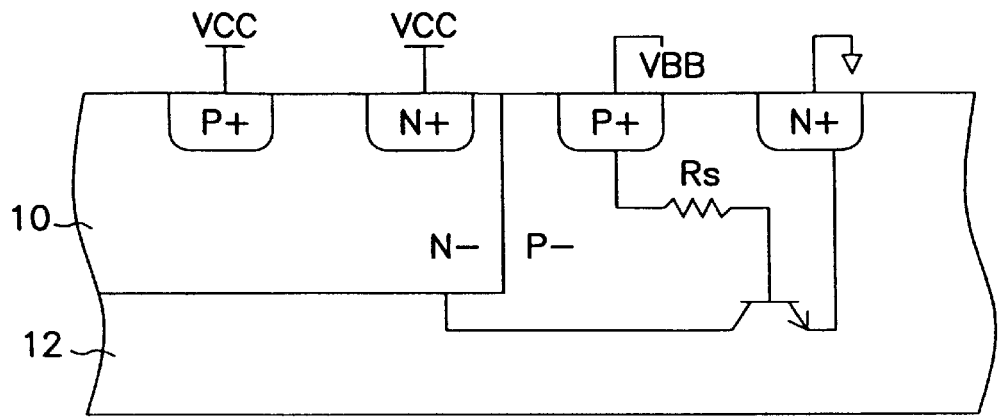
FIG. 1, which is labeled "Prior Art," is a simplified representation of the cross-section of a portion of an integrated circuit device having an n-well region, and wherein a substrate back bias is applied to the substrate in use of the device.
Figure 2:
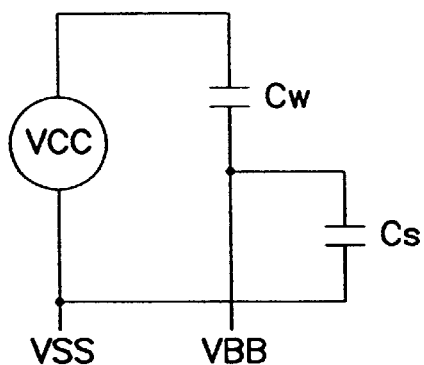
FIG. 2, which is labeled "Prior Art," is a representation of a capacitive divider that is formed by parasitic capacitances in integrated circuit devices in which the substrate is back biased.
Figure 3:
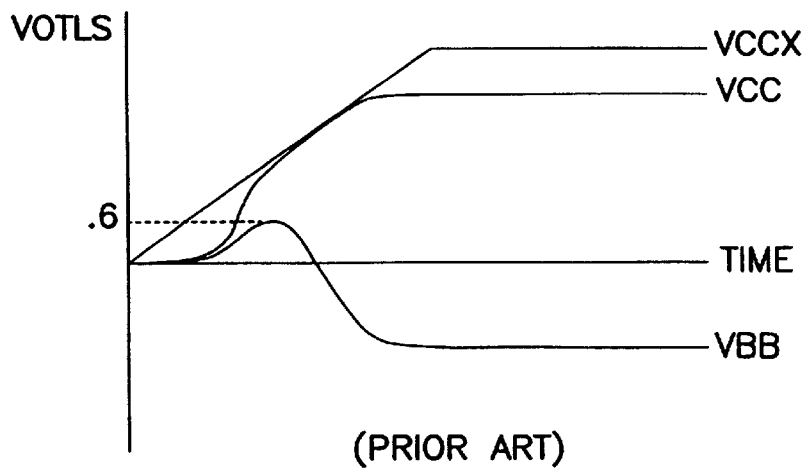
FIG. 3, which is labeled "Prior Art," illustrates the relationship between the substrate back bias voltage and the supply voltage, under power-up conditions, for integrated circuit devices, such as the integrated circuit device shown in FIG. 1.
Figure 4:
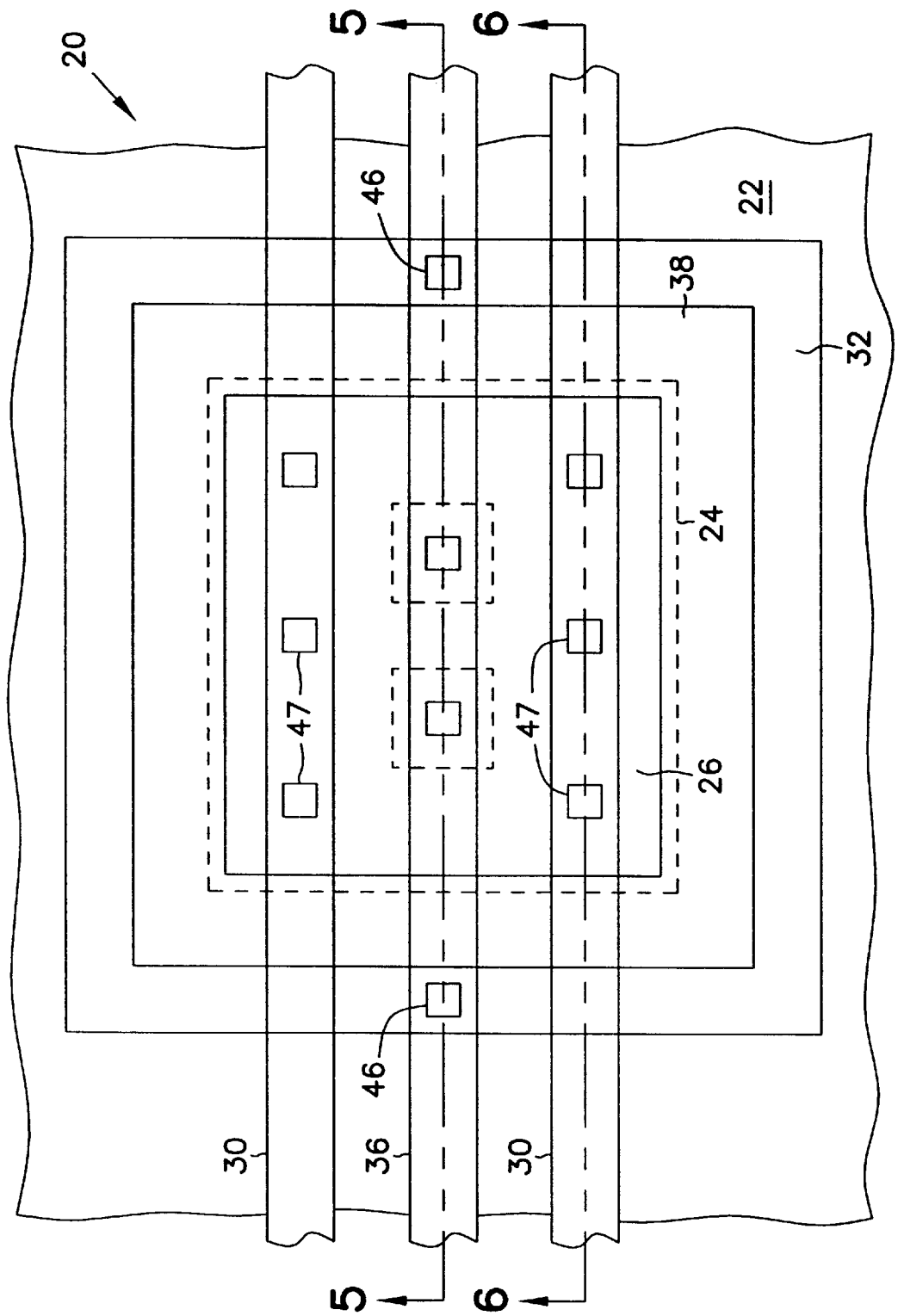
FIG. 4 is a plan view of a portion of an integrated circuit device having an n-well region with a substrate back bias applied to the substrate, and which includes Schottky diodes for clamping the back bias supply to ground in accordance with the invention.

Reference is now made to FIG. 4, which is a fragmentary plan view of a portion of an integrated circuit device 20 incorporating the latch-up prevention mechanism provided by the invention. In the exemplary embodiment, the integrated circuit device is the type of device that uses an on-chip substrate back bias voltage VBB for maintaining the substrate 22 below the negative supply rail VSS, or ground, in use of the device. In the exemplary embodiment, the integrated circuit device is a dynamic random access memory (DRAM). However, the invention can be incorporated into any type of integrated circuit device that is susceptible to latch-up.

Figure 5:
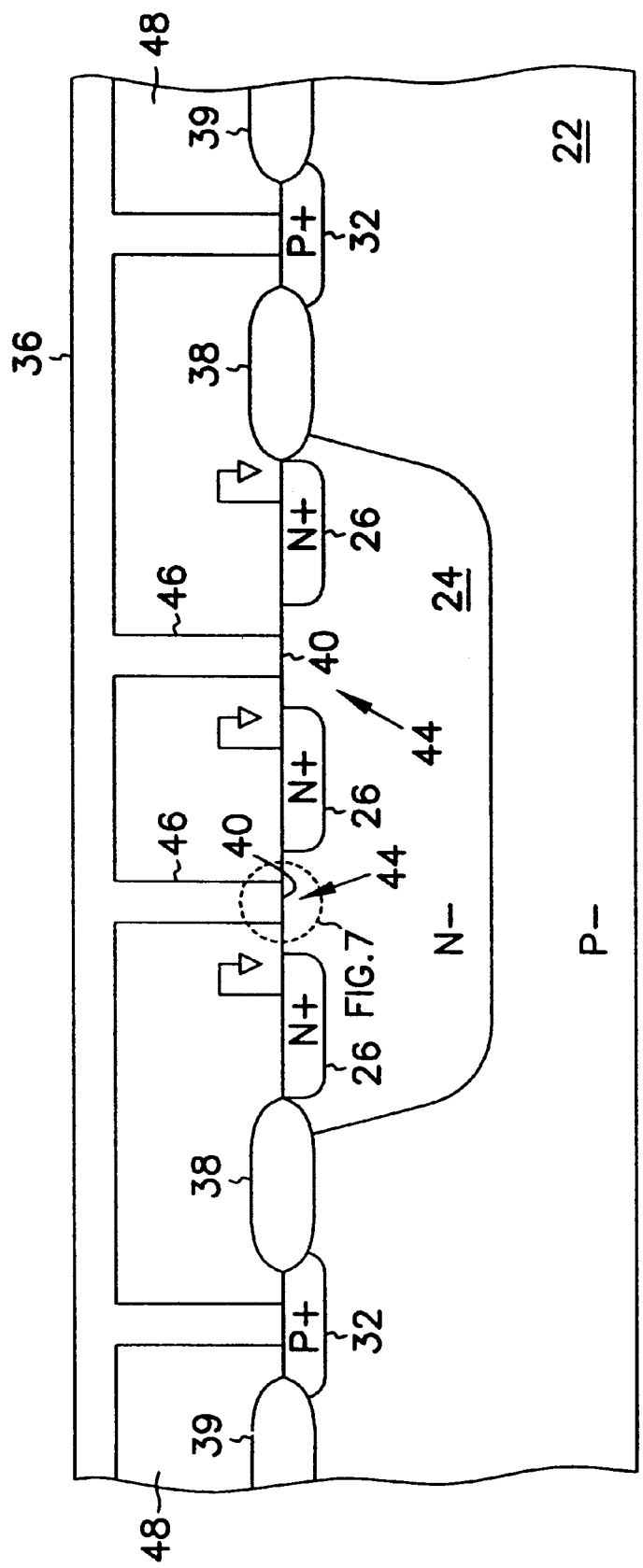
FIG. 5 is a vertical section view taken along the line 5—5 of FIG. 4.
Figure 6:
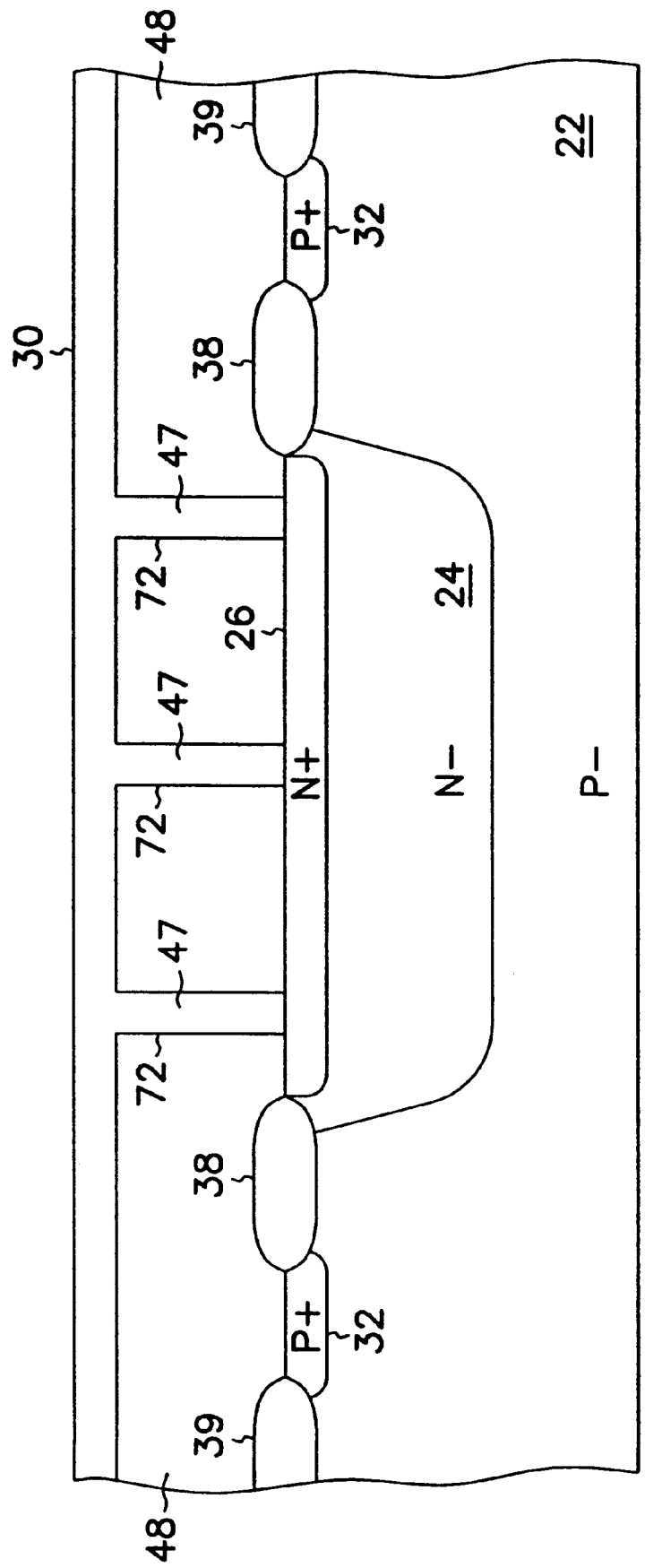
FIG. 6 is a vertical section view taken along the line 6—6 of FIG. 4.

Referring additionally to FIGS. 5 and 6, the integrated circuit device 20 is formed on a semiconductor substrate 22 of a material of a first conductivity type. In the exemplary embodiment, the substrate is formed of a p-type material, such as silicon. A shallow well 24 of the opposite conductivity type, which is n-type material in the exemplary embodiment, is formed in the substrate 22. In the exemplary embodiment, the n-well region is generally rectangular in shape. However, the n-well region can be of other configurations.

A heavily n-doped region 26 (FIG. 4) is formed in the n-well region 24 to facilitate connection of metal conductors 30 by metal plugs 47 (shown in FIG. 6) to the n-well region 24. The conductors 30 are adapted to be connected to a source of a reference potential VSS, such as ground. In addition, a heavily p-doped region 32 (FIG. 4) is formed in the substrate 22. The p-doped region 32 is generally rectangular in shape and extends around the n-well region 24, spaced therefrom by field oxide 38 that is provided along the inner periphery of the p-doped region 32. Further field oxide 39 is provided along the outer periphery of the p-doped region 32. The p-plus doped region 32 facilitates connection of a metal conductor 36 to the substrate. The conductor 36 is adapted to be connected to a source of a back bias voltage VBB for the substrate 22. The metal conductors 30 and 36 are formed on a layer of a dielectric material 48 (shown in FIGS. 5 and 6), such as silicon dioxide, that is formed over the active area of the integrated circuit device. The conductors are connected to the active areas of the integrated circuit device via contact holes formed through the dielectric 48 down to the n-plus doped region 26 and the p-plus doped region 32 in the manner known in the art.

Figure 7:
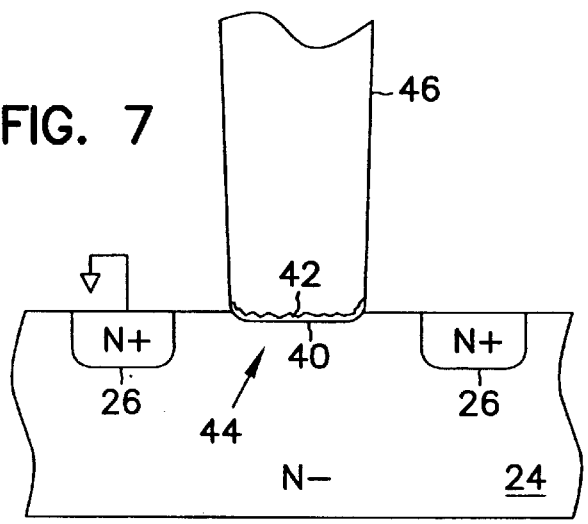
FIG. 7 is an enlarged detail view illustrating the portion of the integrated circuit device that is contained within the circle in FIG. 5.

With continued reference to FIG. 5, in accordance with the invention, the substrate bias conductors, such as conductor 36, are clamped to ground through a plurality of rectifying junctions 40 that are formed in lightly doped portions 44 of the n-well region 24. In the exemplary embodiment, each of the rectifying junctions 40 is formed by a barrier diffusion layer 42, shown in FIG. 7, of a metal such as titanium nitride, which is deposited on lightly doped portions 44 of the n-well region 24. A metal plug 46 connects the barrier diffusion layer 42 to the substrate bias conductor 36. The contact of the metal that forms the barrier diffusion layer 42 with the lightly doped silicon material of the n-well region 24 defines a rectifying junction 40 forming a Schottky diode. A path to ground is provided from the substrate bias conductor 36, through the metal plug 46, the barrier diffusion layer 42, and the lightly doped portion 44 of the n-well region 24 to the ground connected n-plus doped region 26. The ground connection, which is shown schematically in FIG. 5 to simplify the drawing, is provided by metal plugs 47 (FIG. 6) which extend through the dielectric material 48 between the ground conductor 30 and the n-plus doped region 26.

The Schottky diode 40 clamps the substrate 22 to ground during power up conditions. The turn-on voltage of the Schottky diode is about 0.3 volt which is half the turn-on voltage for the conventional diode junctions of field-effect transistors. Moreover, the Schottky diode 40 is characterized by fast turn-off at a specified current, as is known in the art.

Figure 8:
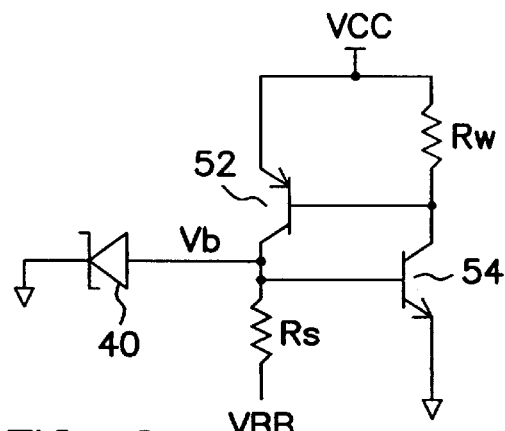
FIG. 8 is a two-transistor representation of the parasitic characteristic that is provided by pnpn junctions of the integrated circuit device of FIG. 4, and wherein the integrated circuit device includes a Schottky diode for shunting the parasitic npn transistor of the integrated circuit device in accordance with the invention.

Referring to FIG. 8, there is shown a two transistor representation of the parasitic characteristics provided by pnpn junctions of the integrated circuit device of FIG. 4. The two parasitic transistors 52 and 54 are cross-coupled with the collector of each transistor driving the base of the other transistor. The emitter of the parasitic pnp transistor 52 is connected to the supply voltage VCC and the emitter of the parasitic npn transistor 54 is connected to ground. In addition, the collector of the parasitic npn transistor 54 is connected to the supply voltage VCC through the n-well region 24 (FIG. 5) as represented by the resistive element Rw. Similarly, the collector of the parasitic pnp transistor 52 is connected to the substrate back bias voltage VBB through the substrate 22 (FIG. 5) as represented by the resistive element Rs.

Figure 9:
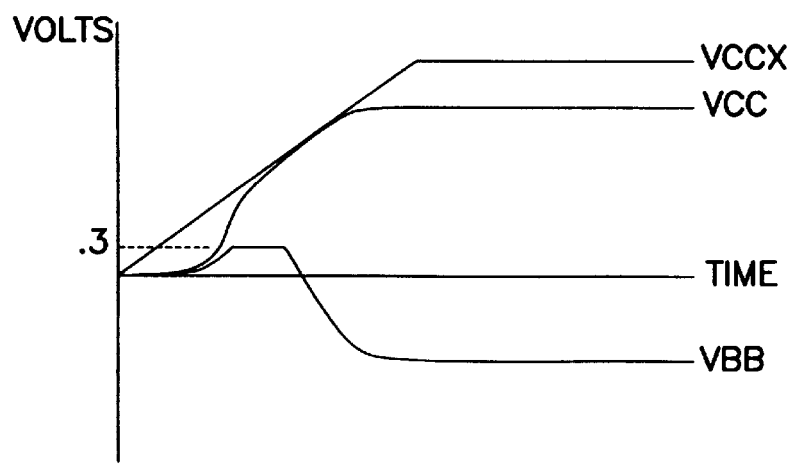
FIG. 9 illustrates the relationship between the substrate back bias voltage and the supply voltage for the integrated circuit device shown in FIG. 4, and illustrating how the Schottky diode clamps the substrate voltage during power up.

In accordance with the invention, the Schottky diode 40 is connected in shunt with the base-emitter circuit of the parasitic npn transistor 54 between the substrate and ground. Thus, the rectifying junction is formed between substrate and ground and functions to clamp the substrate voltage to approximately 0.3 volts which is the voltage drop across the diode, and which is less than the turn-on voltage for the parasitic npn transistor. FIG. 9 illustrates the relationship between the substrate back bias voltage and the supply voltage for the integrated circuit device as a function of time, and illustrates how the Schottky diode clamps the substrate voltage during a power-up condition. As is shown in FIG. 9, as the regulated voltage VCC increases during a power up condition, initially, the substrate voltage VBB also increases until the turn-on voltage of the Schottky diode 40 is reached. At such time, the diode 40 conducts, clamping the substrate to a voltage of about 0.3 volts which corresponds to the voltage drop across the Schottky diode. When the substrate bias generator turns on, the substrate voltage VBB is driven negative, reverse-biasing the Schottky diode 40 which then ceases conducting.

One method for fabricating the integrated circuit device incorporating the latch-up prevention mechanism provided by the invention is described with reference to FIGS. 10A–10H. It is pointed out that the following description focuses on the fabrication of Schottky diodes in a portion of an active region of an integrated circuit device and that typically, this fabrication process is incorporated into a process that includes the forming of transistors and other semiconductor structures, with the Schottky diodes being formed as part of that process.

Figure 10A:
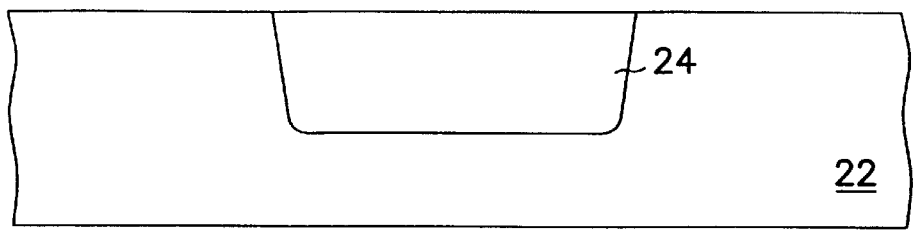
FIGS. 10A–10H are cross-section views illustrating steps in the process of forming the integrated circuit device of FIG. 4.
Figure 10B:
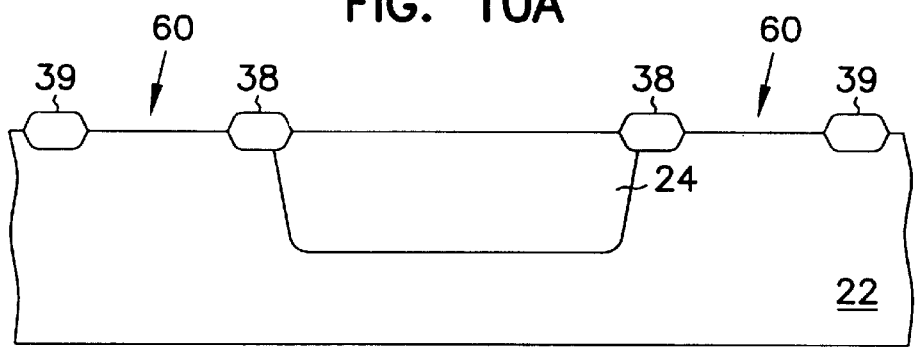

Referring first to FIG. 10A, initially, a substrate 22 of a first conductivity type is processed in the conventional manner to include a well region 24 of a material of the opposite conductivity type and which is formed on the substrate. In the exemplary embodiment, the substrate is a p-type material and the well region is an n-type material. The p-type substrate material can be silicon or any other suitable material of this conductivity. The n-well region 24 can be formed of a material such as phosphorous or arsenic and can have a concentration of about $5 \times 10^{15}$ atoms per cubic centimeter, for example. However, other materials and other concentrations can be used depending upon application. As has been indicated, in other embodiments, the substrate can be of n-type material, with the well region being formed of p-type material. In such embodiments, appropriate n-doping and p-doping materials are used to define ohmic contacts for metal conductors.

Continuing with fabrication of the integrated circuit structure of the exemplary embodiment, a layer of field oxide is grown or deposited onto the main surface of the silicon substrate. The field oxide layer is formed using the local oxidation of silicon (LOCOS) process with active areas, such as the n-well region 24 and the locations 60 for the p-plus doped region 26 shown in FIG. 10B, being covered to prevent field oxide from being formed in these areas. The LOCOS process forms field oxide areas 38 and 39 as shown FIG. 10B.

Figure 10C:
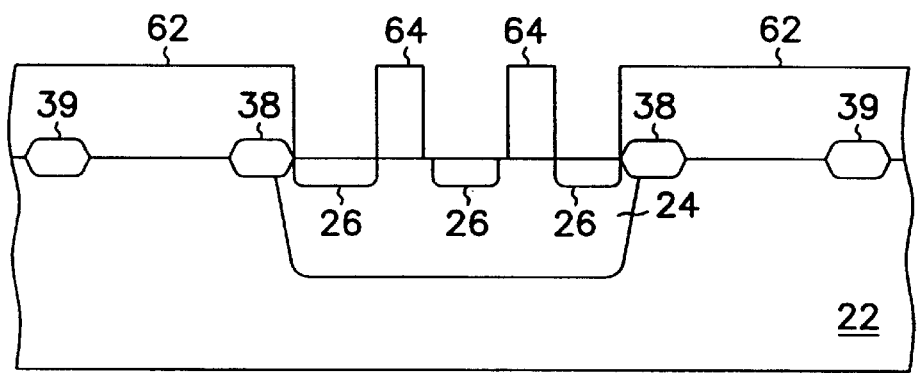

Referring to FIG. 10C, the n-plus doped region 26 is formed using ion-implantation of a high concentration of an n-type material. Areas that are not to be implanted are covered with an n-plus implant masking layer of photo resist, including photo resist portions 62 formed over the locations 60 for the p-plus doped regions 32, and photo resist portions 64 formed over those portions of the n-well region 24 in which the Schottky diodes will be formed. Thus, the n-plus implant masking layer masks out the locations 60 for the p-plus doped regions, as well as the lightly n-doped well portions 44 of the n-well region 24, during implantation of the n-plus material that forms the n-plus doped region 26. Consequently, the need for an additional mask and additional process step are eliminated by the invention because the n-plus implant mask is used in maintaining the lightly n-doped areas 44 in the n-well region. The n-plus ion implantation is carried out using conventional processing techniques and process parameters and accordingly, is not described in detail. By way of example, the n-plus dopant can be arsenic and the n-plus dopant concentration can be about $1\times10^{19}$ to $1\times10^{21}$ atoms per cubic centimeter. However, other materials, such as phosphorous, and other concentrations can be used, depending upon application. The n-plus implant masking layer of photo resist is removed after the n-plus ion implantation has been completed.

Figure 10D:
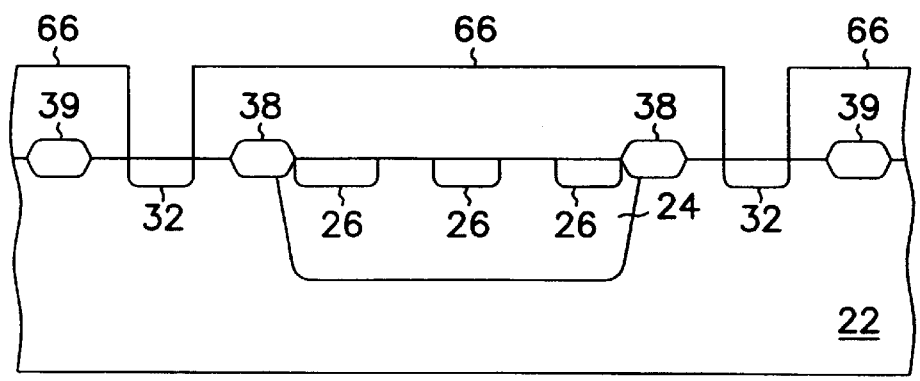

Referring now to FIG. 10D, the p-plus doped region 32 is formed on the substrate 22 in the conventional manner. A p-plus mask is used to form a layer of photo resist 66 for covering the n-plus contact areas and the field oxide regions during implantation of the p-plus material. The p-plus ion implantation is carried out using conventional processing techniques and process parameters, and accordingly, is not described in detail. By way of example, the p-plus dopant can be a material such as boron, and the p-plus dopant concentration can be about $1\times19^{19}$ to $1\times10^{21}$ atoms per cubic centimeter. However, other materials and other dopant concentrations can be used. The p-plus implant masking layer of photo resist is removed after the p-plus ion implantation has been completed.

Figure 10E:
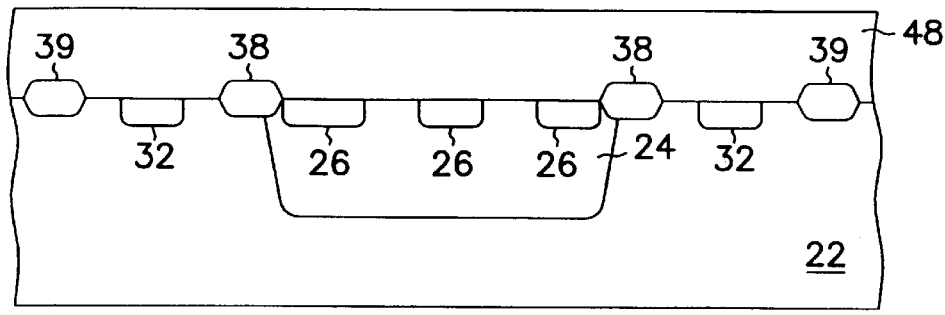
Figure 10F:
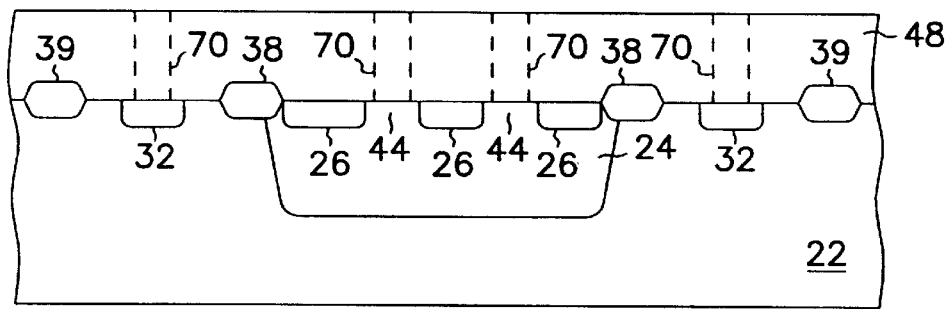

Then, a blanket layer of a dielectric material 48, such as silicon dioxide, is formed on the integrated circuit structure in the conventional manner as shown in FIG. 10E. Contact holes 70 are formed through the layer of dielectric material 48 by chemically etching the silicon dioxide down to the p-plus doped region 32 and the lightly n-doped portion 44 of the n-well region, as shown in FIG. 10F. Further contact holes, not shown in FIG. 10F, are formed through the layer of dielectric material 48 down to the n-plus doped region 26. Referring to FIG. 6, the contact holes that are formed for providing connections between the n-plus doped region 26 and the metallization layer 30 are indicated by reference numeral 72. The formation of dielectric layers and the metallizations are carried out using conventional processing techniques and process parameters known in the art.

Figure 10G:
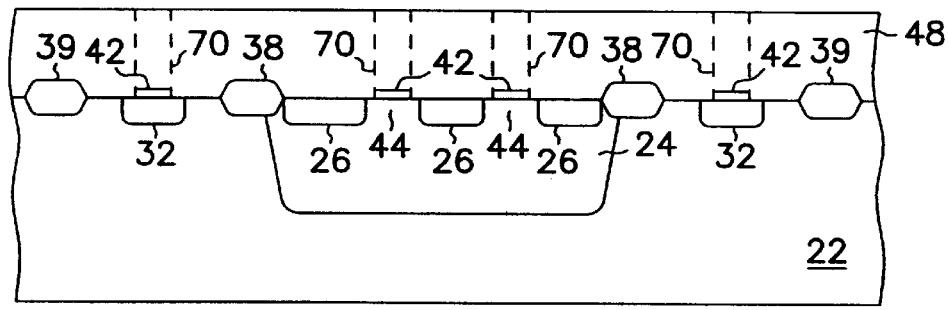

Referring now to FIG. 10G, after the contact holes have been formed, passive diffusion barriers, such as diffusion barriers 42, are formed. A material such as titanium nitride (TiN) can be used to form the diffusion barriers. In the exemplary embodiment, the titanium nitride material is sputtered onto the lightly doped portion 44 of the n-well region 24 that are exposed within the contact holes 70 and simultaneously, onto the surfaces of the heavily p-plus doped region 32 that are exposed within the contact holes 70. At the same time, the titanium nitride material is sputtered onto the surfaces of the portions of the heavily n-plus doped region 26 that are exposed in contact holes 72 (FIG. 6). In the regions where the contact material contacts the lightly doped portion 44 of the n-well region 24, a rectifying junction 40 is formed, producing the Schottky diodes which provide latch-up prevention in accordance with the invention.

Figure 10H:
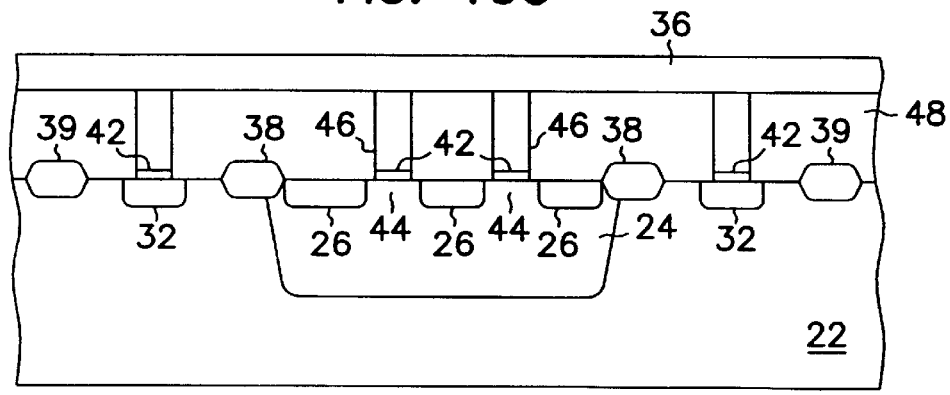

With reference to FIG. 10H, then the contact holes are filled with tungsten using a conventional process, such as blanket chemical vapor deposition CVD of the tungsten material on the entire surface. The deposition process is followed by etchback so that the tungsten layer remains only in the contact holes. This process produces the contact plugs 46 and the contact plugs 47 (shown in FIG. 6).

Metallization of the integrated circuit structure is completed by depositing a blanket metallization layer of a suitable conducting material, such as by sputtering aluminum onto the integrated circuit structure, or by using any other suitable process. The resultant metallization covers the top surface of the integrated circuit structure in electrical contact with the contact plugs 46 and 47 exposed in the top surface. The metallization layer is then etched to form the desired pattern for the ground conductors 30 and the substrate bias conductors 36.

As is shown in FIG. 10H, in forming the substrate bias conductor 36, the metal also extends into electrical and mechanical contact with the barrier layers, connecting the diodes to the substrate bias conductor 36. The conductors can be formed of a straight metal, such as aluminum, or a metal-silicide in contact with the n-plus doped region 26 and the p-plus doped region 32 that are exposed through contact holes formed through the dielectric film. It is pointed out that the metallization process, including forming of the contact holes, forming the diffusion barriers, forming the contact plugs 46, 47 and forming the conductors 30 and 36 that are connected to the diffusion barrier layers, can be carried out using conventional process steps known in the art.

Following the patterning of the final metal layer, processing of the integrated circuit device that is being fabricated on the semiconductor substrate 22 can be completed using conventional techniques to provide a suitable passivation layer over the entire top surface of the wafer.

Figure 11:
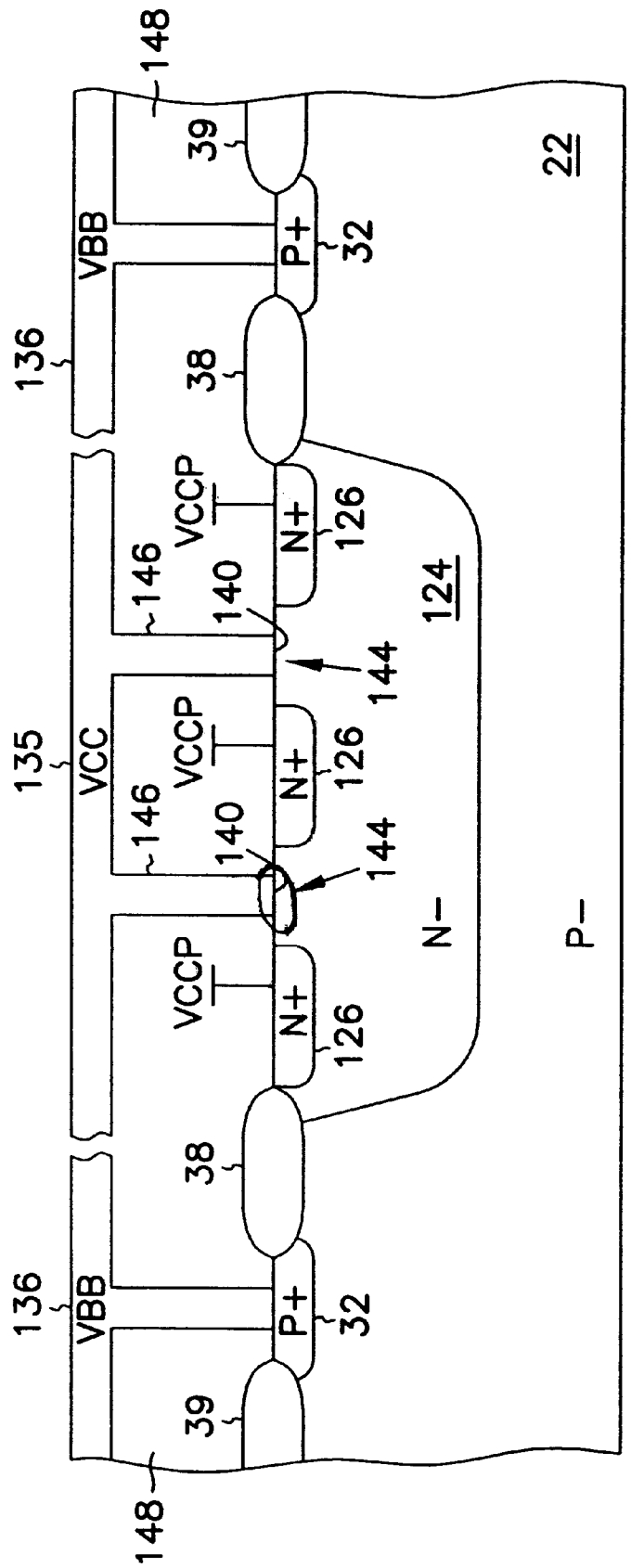
FIG. 11 is a vertical section view of a portion of an integrated circuit device having an n-well region when a boosted bias is applied to the n-well region, and which includes Schottky diodes for clamping the boosted bias voltage to the chip supply voltage in accordance with the invention.

Referring now to FIG. 11, in accordance with another embodiment of the invention, Schottky diodes are used to prevent a pumped bias VCCP for an n-well region 124 and voltage applied to the n-well region, from falling more than one Vt below the supply voltage VCC. FIG. 11 represents a further fragmentary portion of the integrated circuit device 20 shown in FIGS. 4–7, and elements of the integrated circuit portion shown in FIG. 11 have been given the same reference numerals as corresponding elements in FIG. 5, but in a "100" series. In FIG. 11, the pumped bias VCCP is applied to the n-well region by way of the n-plus doped region 126. The supply voltage VCC is applied to the n-well regions by conductors 135 through a plurality of rectifying junctions 140 that are formed in lightly doped portion 144 of the n-well region 124. In the exemplary embodiment, each of the rectifying junctions 140 is formed by a barrier diffusion layer of a metal such as titanium nitride, which is deposited on the lightly doped portion 144 of the n-well region 124 in the manner shown in FIG. 7 for barrier diffusion layer 42. A metal plug 146 connects the barrier diffusion layer to the VCC supply voltage rail 135. The contact of the metal that forms the barrier diffusion layer with the lightly doped silicon material of the n-well region 124 defines a rectifying junction 140 forming a Schottky diode. A path to the pumped bias voltage VCCP is provided from the VCC supply voltage rail 135, through the metal plug 146, the barrier diffusion layer, and the lightly doped portion 144 of the n-well region 124 to the n-plus doped region 126. The VCCP bias voltage connection 147, which is shown schematically in FIG. 11 to simplify the drawing, is provided by metal plugs (not shown) which extend through the dielectric material 148 between the pumped voltage VCCP conductors and the n-plus doped region 126. The integrated circuit device incorporating the Schottky diodes 140 can be fabricated using the method that has been described above with reference to FIGS. 10A–10H and simultaneously with the formation of the Schottky diodes 40.

Figure 12:
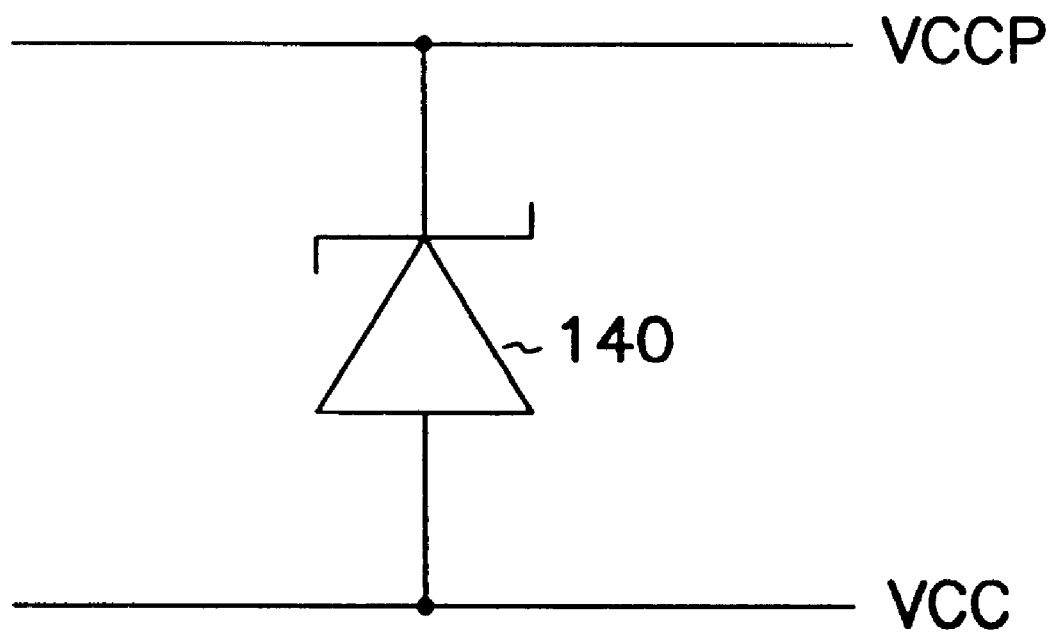
FIG. 12 is schematic representation of one of the Schottky diodes shown in FIG. 11.

Referring to FIG. 12, the Schottky diodes 140 formed in the n-well region in the portion of the integrated circuit device shown in FIG. 11 extend between the supply rail VCC and the pumped bias voltage VCCP for clamping the n-well region 124 to the supply voltage VCC during power up conditions. The turn-on voltage of the Schottky diode is about 200 to 300 millivolts, which is considerably lower than the 700 millivolts required to forward bias the diffusion pn junctions that are formed when the n-well region is produced. If the pumped bias voltage VCCP falls below the supply voltage VCC by about 200 to 300 millivolts, the Schottky diode conducts and clamps the n-well region to the supply voltage VCC. When the pumped voltage VCCP is increased, the diode 140 is back biased and ceases to conduct.

Thus, it has been shown that the invention provides an integrated circuit device having a Schottky diode formed on the substrate of the device for clamping the substrate to ground during power up conditions. A back substrate back bias is applied to the substrate of the device for maintaining the substrate at a below ground potential in use of the device. The diode prevents latch-up of the device during power up as could otherwise be caused by the capacitive divider that is formed by the parasitic capacitance that exists between the integrated circuit structure power terminal and the substrate and the parasitic capacitance that exists between the VSS power terminal and the substrate, as a result of semiconductor junctions.

What is claimed is:

1. A method for preventing latch-up in an integrated circuit device, wherein parasitic bipolar structures are formed in a substrate of the integrated circuit device, the parasitic bipolar structures including a parasitic pnp transistor and a parasitic npn transistor, the parasitic npn transistor having a base-emitter circuit, and wherein the substrate of the integrated circuit device is back biased by a substrate back bias voltage in use of the integrated circuit device; said method comprising:

coupling a source of pumped reference potential to a second voltage source through a path including a Schottky rectifying junction for limiting the voltage across the base-emitter circuit of the parasitic npn transistor to a value that is less than the turn-on level for the parasitic npn transistor.

2. A method for fabricating an integrated circuit structure on a substrate of a material of a first conductivity type; said method comprising:

forming in the substrate a well region of a material of a second conductivity type;

forming a first metal conductor in electrical contact with a first portion of the well region for coupling the first portion of the well region to a first pumped voltage source;

forming a second metal conductor in electrical contact with a second portion of the well region for coupling the well region to a second voltage source, the first pumped voltage source being greater in potential than the second voltage source;

forming a third metal conductor in electrical contact with the first portion of the well region and connected to a third voltage source; and forming a Schottky rectifying junction in said second portion of the well region for coupling the second voltage source to the first pumped voltage source through a path including the Schottky rectifying junction.

3. The method according to claim 2, wherein forming the second metal conductor includes forming a portion of the second metal conductor in electrical contact with the substrate for coupling the substrate to the first pumped voltage source through the Schottky rectifying junction.

4. The method according to claim 2, including performing an ion implantation of a dopant of the second conductivity type into a first portion of the well region while preventing ion implantation of the dopant of the second conductivity type into a second portion of the well region.

5. The method according to claim 4, wherein forming the Schottky rectifying junction includes providing a barrier layer of an electrically conducting material on said second portion of the well region.

6. A method for fabricating an integrated circuit structure on a substrate of a p-type material, said method comprising:

forming in the substrate a well region of an n-type material;

forming a first metal conductor on the substrate for coupling the substrate to a source of a negative substrate bias;

forming a second metal conductor on the substrate for coupling the n-well region to a source of a pumped potential;

forming a Schottky rectifying junction in a lightly n-doped portion of the n-well region; and electrically connecting the Schottky rectifying junction to a reference potential through a path including the first metal conductor, the Schottky rectifying junction, the n-well region, and the second metal conductor.

7. The method according to claim 6, including performing an ion implantation of an n-plus dopant into a first portion of the n-well region, and wherein forming the second metal conductor includes depositing metal in electrical contact with said first portion of the n-well region.

8. The method according to claim 7 wherein forming the Schottky rectifying junction includes preventing ion implantation of the n-plus dopant into a second portion of the n-well region for maintaining a lightly n-doped portion in the n-well region, and depositing a layer of metal on said second portion of the n-well region to form a barrier layer.

9. The method according to claim 8, including electrically connecting said barrier layer to said first metal conductor.

10. The method according to claim 9, wherein performing the n-plus ion implantation includes using an n-plus ion implantation mask to define portions of the n-well region into which the n-plus dopant is to be implanted, and using the n-plus ion implantation mask for masking said second portion of the n-well region during implantation of the n-plus dopant, for maintaining said lightly n-doped portion in the n-well region exposed in the n-well region following the n-plus ion implantation step.

11. A method for fabricating an integrated circuit structure, said method comprising:

providing a p-type substrate;

forming an n-well region in the p-type substrate;

performing an ion implantation of an n-plus dopant into a first portion of the n-well region using an n-plus mask that exposes the first portion of the n-well region using the n-plus mask to maintain a second portion of the n-well region unexposed during the implantation of the n-plus dopant to maintain the second portion of the n-well region lightly n-doped;

forming a barrier layer of metal on the lightly n-doped portion of the n-well region to thereby create a Schottky rectifying junction;

forming a first metal conductor in electrical contact with the first portion of the n-well region for connecting a pumped potential to the n-well region; and forming a second conductor in electrical contact with the barrier layer for connecting the pumped potential to a reference potential through the Schottky rectifying junction.

12. The method according to claim 11, wherein forming the first conductor includes forming a barrier layer of metal on the heavy doped first portion of the n-well region.

\* \* \* \* \*